(12) United States Patent
Choi

(10) Patent No.: US 6,972,229 B2
(45) Date of Patent: Dec. 6, 2005

(54) METHOD OF MANUFACTURING SELF-ALIGNED NON-VOLATILE MEMORY DEVICE

(75) Inventor: Kyu Hyun Choi, Cupertino, CA (US)

(73) Assignee: 02IC, Inc., Santa Clara, CA (US)

( * ) Notice: Subject to any disclaimer, the term of this patent is extended or adjusted under 35 U.S.C. 154(b) by 34 days.

(21) Appl. No.: 10/746,907

(22) Filed: Dec. 23, 2003

(65) Prior Publication Data

US 2005/0136592 A1    Jun. 23, 2005

(51) Int. Cl.[7] .......................................... H01L 21/336
(52) U.S. Cl. ...................... 438/257; 438/201; 438/265; 438/593
(58) Field of Search ................ 438/257, 201, 438/258, 260, 261, 262, 265, 266, 593

(56) References Cited

U.S. PATENT DOCUMENTS

| | | |
|---|---|---|
| 4,070,655 A | 1/1978 | Schurmeyer et al. |
| 4,128,773 A | 12/1978 | Troutman et al. |
| 4,132,904 A | 1/1979 | Harari |
| 4,193,128 A | 3/1980 | Brewer |
| 4,271,487 A | 6/1981 | Craycraft et al. |
| 4,462,090 A | 7/1984 | Iizuka |
| 5,051,951 A | 9/1991 | Maly et al. |
| 5,085,362 A | 11/1991 | Herdt et al. |
| 5,396,461 A | 3/1995 | Fukumoto |
| 5,408,115 A | 4/1995 | Chang |
| 5,619,470 A | 4/1997 | Fukumoto |
| 5,646,885 A | 7/1997 | Matsuo et al. |
| 5,946,566 A | 8/1999 | Choi |
| 5,939,383 A | 10/1999 | Chang et al. |
| 5,966,601 A * | 10/1999 | Ling et al. ................... 438/257 |
| 5,986,932 A | 11/1999 | Ratnakumar et al. |
| 6,091,634 A | 7/2000 | Wong |
| 6,118,157 A | 9/2000 | Bergemont |
| 6,175,268 B1 | 1/2001 | Merrill |
| 6,222,765 B1 | 4/2001 | Nojima |
| 6,242,774 B1 | 6/2001 | Sung |
| 6,266,272 B1 | 7/2001 | Kirihata et al. |
| 6,285,575 B1 | 9/2001 | Miwa |
| 6,363,011 B1 | 3/2002 | Hirose et al. |
| 6,370,058 B1 | 4/2002 | Fukumoto |
| 6,388,293 B1 | 5/2002 | Ogura et al. |
| 6,414,873 B1 | 7/2002 | Herdt |
| 6,426,894 B1 | 7/2002 | Hirano |
| 6,451,643 B2 * | 9/2002 | Komori et al. ............. 438/263 |
| 6,514,819 B1 | 2/2003 | Choi |
| 6,532,169 B1 | 3/2003 | Mann et al. |
| 6,573,130 B1 * | 6/2003 | Patelmo et al. ............. 438/258 |

(Continued)

*Primary Examiner*—Kevin M. Picardat
(74) *Attorney, Agent, or Firm*—Townsend and Townsend and Crew LLP

(57) ABSTRACT

A method of forming a self-aligned non-volatile device, includes, in part: forming trench isolation regions, forming a well between the trench isolation, forming a second well above the first well, forming a first oxide layer above a first portion of the second well, forming a first dielectric, a first polysilicon gate, and a second dielectric layer, respectively, above the first polysilicon layer, forming a first spacer above the body region and adjacent the first polysilicon layer, forming a second oxide layer above a second portion of the second well not covered by the first spacer, forming a second polysilicon gate layer above the second oxide layer, the first spacer and a portion of the second dielectric layer, removing the second polysilicon layer and the layers below it that are exposed in a via formed using a mask, thereby forming self-aligned source/drain regions.

11 Claims, 8 Drawing Sheets

U.S. PATENT DOCUMENTS

| | | | |
|---|---|---|---|
| 6,624,015 B2 * | 9/2003 | Patelmo et al. | 438/258 |
| 6,654,278 B1 | 11/2003 | Miws | |
| 6,699,753 B2 * | 3/2004 | Ma et al. | 438/257 |
| 6,798,003 B2 | 9/2004 | Choi | |
| 6,838,343 B2 * | 1/2005 | Hung et al. | 438/257 |
| 2002/0146886 A1 * | 10/2002 | Chern | 438/295 |
| 2003/0052361 A1 * | 3/2003 | Liu et al. | 438/257 |
| 2003/0223288 A1 | 12/2003 | Choi | |

* cited by examiner

METHOD OF MANUFACTURING SELF-ALIGNED NON-VOLATILE MEMORY DEVICE

CROSS-REFERENCES TO RELATED APPLICATIONS

The present application is related to copending application Ser. No. 10/447,715, filed on May 28, 2003, entitled "Method Of Manufacturing Non-Volatile Memory Device", assigned to the same assignee, and incorporated herein by reference in its entirety.

The present application is also related to copending application Ser. No. 10/394,417, filed on Mar. 19, 2003, entitled "Non-Volatile Memory Device", assigned to the same assignee, and incorporated herein by reference in its entirety.

BACKGROUND OF THE INVENTION

The present invention relates to semiconductor integrated circuits. More particularly, the invention provides a semiconductor memory that has integrated non-volatile and static random access memory cells. Although the invention has been applied to a single integrated circuit device in a memory application, there can be other alternatives, variations, and modifications. For example, the invention can be applied to embedded memory applications, including those with logic or micro circuits, and the like.

Semiconductor memory devices have been widely used in electronic systems to store data. There are generally two types of memories, including non-volatile and volatile memories. The volatile memory, such as a Static Random Access Memory (SRAM) or a Dynamic Random Access Memory (DRAM), loses its stored data if the power applied has been turned off. SRAMs and DRAMs often include a multitude of memory cells disposed in a two dimensional array. Due to its larger memory cell size, an SRAM is typically more expensive to manufacture than a DRAM. An SRAM typically, however, has a smaller read access time and a lower power consumption than a DRAM. Therefore, where fast access to data or low power is needed, SRAMs are often used to store the data.

Non-volatile semiconductor memory devices are also well known. A non-volatile semiconductor memory device, such as flash Erasable Programmable Read Only Memory (Flash EPROM), Electrically Erasable Programmable Read Only Memory (EEPROM) or, Metal Nitride Oxide Semiconductor (MNOS), retains its charge even after the power applied thereto is turned off. Therefore, where loss of data due to power failure or termination is unacceptable, a non-volatile memory is used to store the data.

Unfortunately, the non-volatile semiconductor memory is typically slower to operate than a volatile memory. Therefore, where fast store and retrieval of data is required, the non-volatile memory is not typically used. Furthermore, the non-volatile memory often requires a high voltage, e.g., 12 volts, to program or erase. Such high voltages may cause a number of disadvantages. The high voltage increases the power consumption and thus shortens the lifetime of the battery powering the memory. The high voltage may degrade the ability of the memory to retain its charges due to hot-electron injection. The high voltage may cause the memory cells to be over-erased during erase cycles. Cell over-erase results in faulty readout of data stored in the memory cells.

The growth in demand for battery-operated portable electronic devices, such as cellular phones or personal organizers, has brought to the fore the need to dispose both volatile as well as non-volatile memories within the same portable device. When disposed in the same electronic device, the volatile memory is typically loaded with data during a configuration cycle. The volatile memory thus provides fast access to the stored data. To prevent loss of data in the event of a power failure, data stored in the volatile memory is often also loaded into the non-volatile memory either during the configuration cycle, or while the power failure is in progress. After power is restored, data stored in the non-volatile memory is read and stored in the volatile memory for future access. Unfortunately, most of the portable electronic devices may still require at least two devices, including the non-volatile and volatile, to carry out backup operations. Two devices are often required since each of the devices often rely on different process technologies, which are often incompatible with each other.

To increase the battery life and reduce the cost associated with disposing both non-volatile and volatile memory devices in the same electronic device, non-volatile SRAMs and non-volatile DRAMs have been developed. Such devices have the non-volatile characteristics of non-volatile memories, i.e., retain their charge during a power-off cycle, but provide the relatively fast access times of the volatile memories. As merely an example, FIG. 1 is a transistor schematic diagram of a prior art non-volatile DRAM 10. Non-volatile DRAM 10 includes transistors 12, 14, 16 and EEPROM cell 18. The control gate and the drain of EEPROM cell 18 form the DRAM capacitor. Transistors 12 and 14 are the DRAM transistors. Transistor 16 is the mode selection transistor and thus selects between the EEPROM and the DRAM mode.

FIG. 2 is a transistor schematic diagram of a prior art non-volatile SRAM 40. Non-volatile SRAM 40 includes transistors 42, 44, 46, 48, 50, 52, 54, 56, resistors 58, 60 and EEPROM memory cells 62, 64. Transistors 48, 50, 52, 54 and resistors 58, 60 form a static RAM cell. Transistors 42, 44, 46, 56 are select transistors coupling EEPROM memory cells 62 and 64 to the supply voltage Vcc and the static RAM cell. Transistors 48 and 54 couple the SRAM memory cell to the true and complement bitlines BL and $\overline{BL}$.

EEPROM 18 of non-volatile DRAM cell 10 (FIG. 1) and EEPROM 62, 64 of non-volatile SRAM cell 40 (FIG. 2) may consume a relatively large semiconductor area and may thus be expensive. Moreover, they may also require a high programming voltage and thus may suffer from high-voltage related stress. Accordingly, a need continues to exist for a relatively small non-volatile memory device that, among other things, is adapted for use in a non-volatile SRAM or DRAM and consume less power than those known in the prior art.

While the invention is described in conjunction with the preferred embodiments, this description is not intended in any way as a limitation to the scope of the invention. Modifications, changes, and variations, which are apparent to those skilled in the art can be made in the arrangement, operation and details of construction of the invention disclosed herein without departing from the spirit and scope of the invention.

BRIEF SUMMARY OF THE INVENTION

In accordance with the present invention, a method of forming a self-aligned non-volatile semiconductor device, includes, in part, the steps of: forming at least two trench isolation regions in the semiconductor substrate, forming a first well between the two trench isolation regions, forming a second well between the two trench isolation regions and above the first well to define a body region, forming a first oxide layer above a first portion of the body region, forming a first dielectric layer above the first oxide layer, forming a first polysilicon layer—that forms a control gate of a non-volatile device—above the first dielectric layer, forming a second dielectric layer above the first polysilicon layer, forming a first spacer above the body region and adjacent said first polysilicon layer, forming a second oxide layer above a second portion of the body region that is not covered by the first spacer, forming a second polysilicon layer—that forms a guiding gate of the non-volatile device—above the second oxide layer, the first spacer and the second dielectric layer; forming a masking layer over the second polysilicon layer; forming a via positioned above the first portion of the body region in the masking layer, removing the second polysilicon layer, the second dielectric layer, the first polysilicon layer, the first dielectric layer, and the first oxide layer from regions exposed in the via to form self-aligned source/drain regions; forming a second spacer to define source and drain implant regions of the non-volatile device; and delivering n-type implants in the defined source and drain regions of the non-volatile device.

In some embodiments, the semiconductor substrate is a p-type substrate. In such embodiments, the first well is an n-well formed using a number of implant steps each using a different energy and doping concentration of Phosphorous. Furthermore, in such embodiments, the second well is a p-well formed using a number of implant steps each using a different energy and doping concentration of Boron. In some embodiments, the implant steps used to form the n-well and p-well are carried out using a single masking step.

In some embodiments, the first dielectric layer further includes an oxide layer and a nitride layer and the second dielectric layer is an oxide layer. Moreover, the thickness of the second oxide layer is greater than that of the first oxide layer.

DETAILED DESCRIPTION OF THE INVENTION

According to the present invention, an improved method of forming a non-volatile memory device is provided. Although the invention has been applied to a single integrated circuit device in a memory application, there can be other alternatives, variations, and modifications. For example, the invention can be applied to embedded memory applications, including those with logic or microcircuits, and the like.

Figure 1:
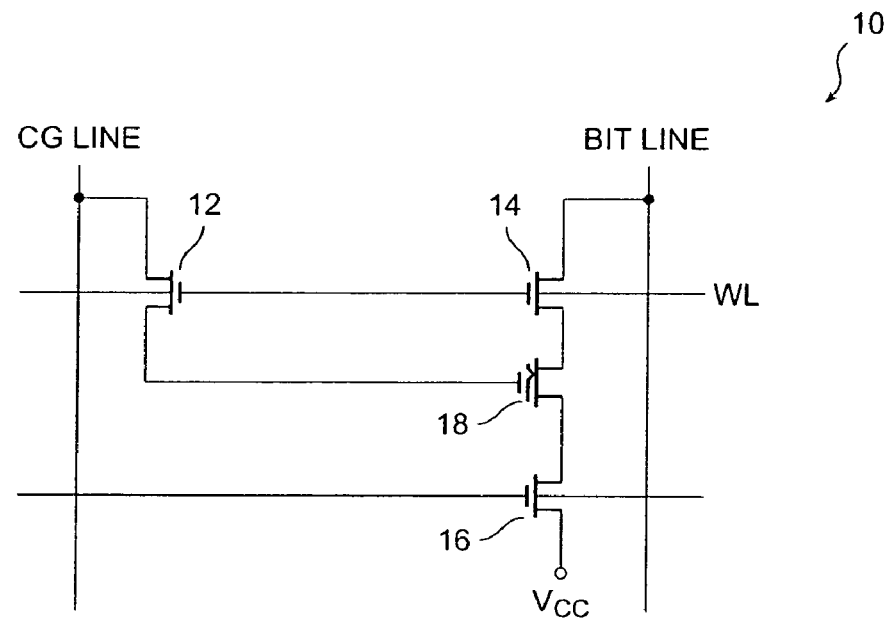
FIG. 1 is a simplified transistor schematic diagram of a non-volatile DRAM, as known in the prior art.
Figure 2:
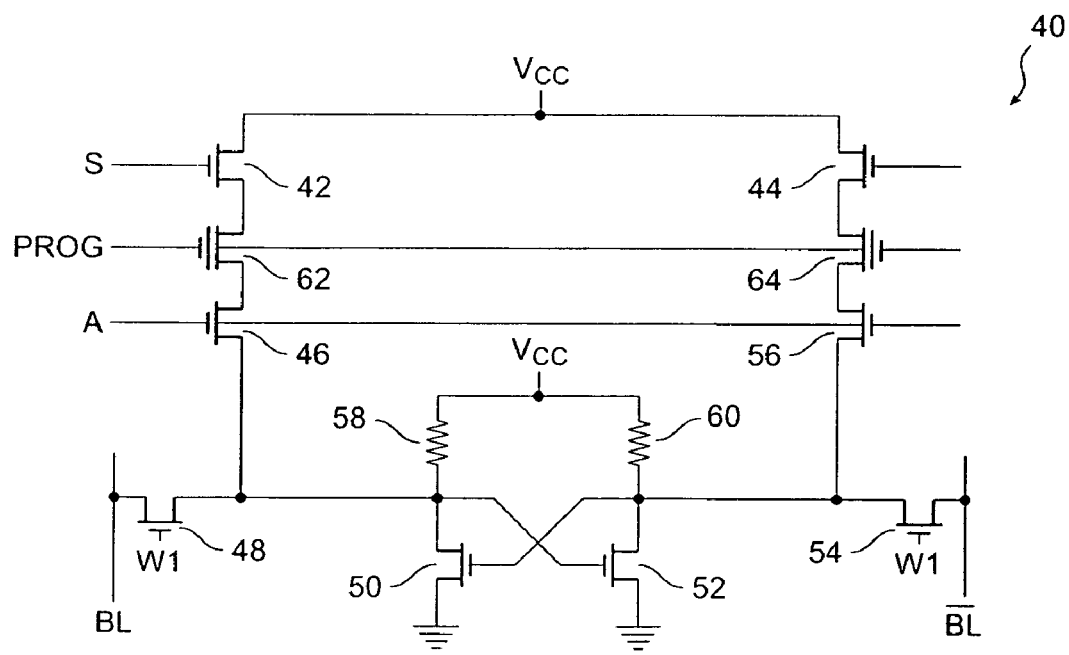
FIG. 2 is a simplified transistor schematic diagram of a non-volatile SRAM, as known in the prior art.
Figure 3:
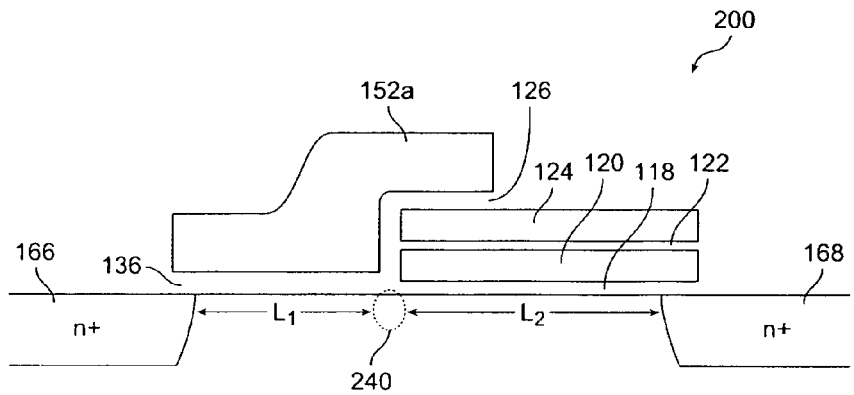
FIG. 3 is a cross-sectional view of a non-volatile memory device, in accordance with one embodiment of the present invention.

FIG. 3 is a cross-sectional view of some of the regions of non-volatile memory device 200 (hereinafter alternatively referred to as device 200), in accordance with the present invention. Device 200 which is formed in, e.g., a p-type semiconductor substrate or a p-well formed in an n-type semiconductor substrate, includes, in part, a guiding gate 152a, a control gate 124, n-type source/drain regions 166 formed in p-well 114. Control gate 124, which is typically formed from polysilicon, is separated from p-type substrate or p-well layer 114 via oxide layer 118, nitride layer 120 and oxide layer 122. Guiding gate 152a, which is also typically formed from polysilicon, is separated from substrate 206 via layer 136. Layer 136 may be an oxide layer or oxinitride layer or any other dielectric layer. Guiding gate 152a partially extends over control gate 124 and is separated therefrom via oxide layer 126. A sequence of steps adapted to manufacture device 200 is described below. In the following, it is understood that similar elements or regions in the drawings are identified with similar reference numerals. Moreover, after various regions or elements in a drawing are identified with their respective reference numerals, the subsequent drawings may omit those reference numerals for simplification purposes.

Figure 4:
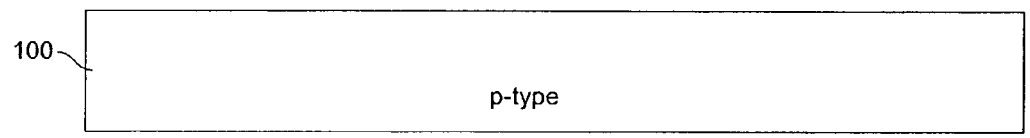
FIG. 4 is a cross-sectional view of a semiconductor substrate in which an integrated circuit including the non-volatile memory device of FIG. 3 is formed.
Figure 5:
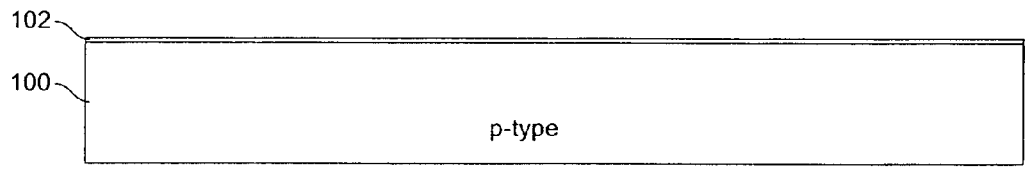
FIG. 5 is a cross-sectional view of the semiconductor structure of FIG. 4 after a layer of pad oxide is formed thereon.
Figure 6:
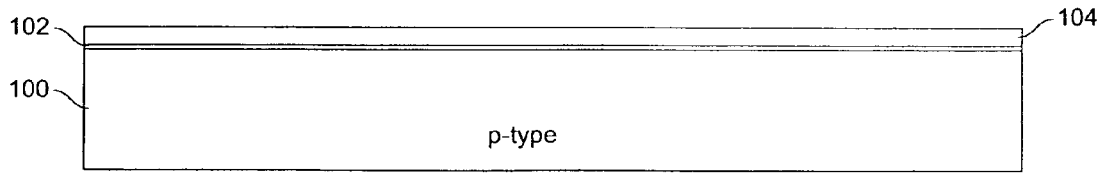
FIG. 6 is a cross-sectional view of the semiconductor structure of FIG. 5 after a layer of nitride is deposited on the pad oxide.
Figure 7:
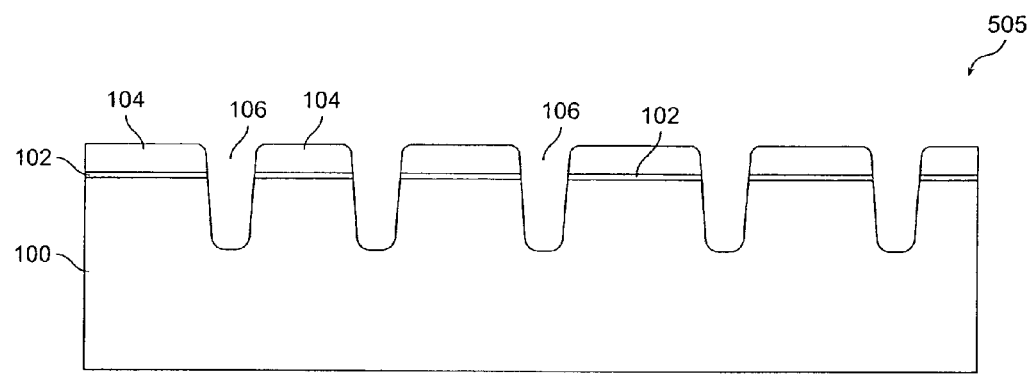
FIG. 7 is a cross-sectional view of the semiconductor structure of FIG. 6 after formation of trench isolation.

FIG. 4 shows a semiconductor substrate 100 in which the non-volatile device 200 shown in FIG. 3 is formed. In the exemplary embodiment described above, substrate 100 is a p-type substrate. It is understood that in other embodiments, substrate 100 may be an n-type substrate. To form non-volatile device 200, a layer of pad oxide 102 having a thickness in the range of, e.g., 60–1000 Å, is grown on substrate 100 using conventional thermal oxidation processes, as shown in FIG. 5. Next, as shown in FIG. 6, a layer of silicon-nitride 104 having a thickness in the range of, e.g., 500–1500 Å, is deposited on pad oxide layer 102. It is understood that the various layers and spacings shown in the Figures are not drawn to scale. Next, using conventional masking and etching steps, shallow trenches 106 are formed in substrate 100, thereby forming structure 505 as shown in FIG. 7. It is understood that in some embodiments, isolation regions formed using conventional locos isolation (not shown) techniques may be used in place of trenches 106.

Figure 8:
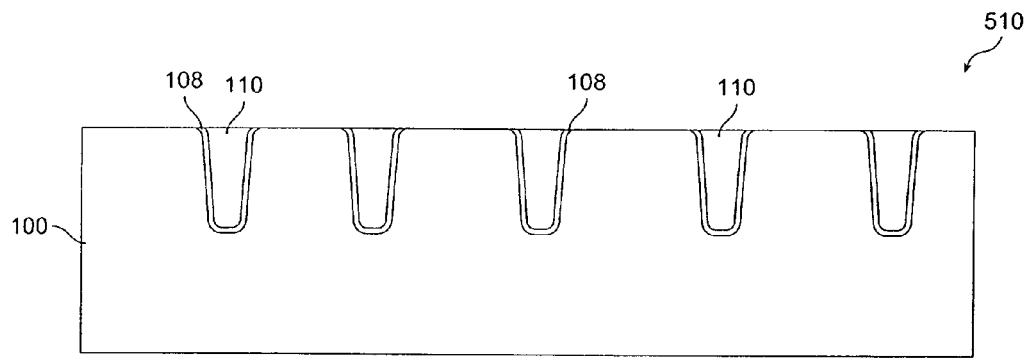
FIG. 8 is a cross-sectional view of the semiconductor structure of FIG. 7 after the trench isolations are filled with dielectric materials.

After shallow trenches 106 are formed, a layer of oxide having a thickness of, e.g., 150 Å, is grown over structure 505. This oxide is also grown in trenches 106. Next, a layer of TEOS having a thickness of, e.g., 5000–10,000 Å is deposited on the oxide. This TEOS layer is also deposited in trenches 106. Thereafter, using a planarization technique, such as chemical-mechanical polishing (CMP), the resulting structure is planarized. FIG. 8 shows the resulting structure 510 after the planarization process. As is seen from FIG. 8, as all the layers overlaying substrate 100, except for the oxide layer 108 and TEOS layer 110 formed in trenches 106, are removed.

Figure 9:
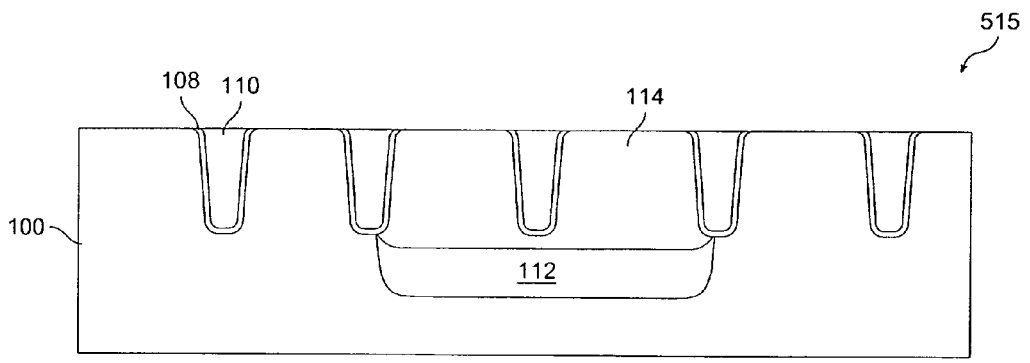
FIG. 9 is a cross-sectional view of the semiconductor structure of FIG. 8 after formation of an n-well and a p-well defining a body region in which the non-volatile device of FIG. 3 is formed.

Next, as shown in FIG. 9, using conventional photo-resist patterning and etching steps, n-well 112 and p-well 114 are formed. As seen from FIG. 9, n-well 112 is deeper than and formed before p-well 114. In some embodiments, a Phosphorous implant with a concentration of $2.0e^{13}$ atoms/cm$^2$ and using an energy of 1.5 Mega-electron volts is used to form n-well 112. In such embodiments, three to six separate Boron implants are used to form p-well implant 114. The first Boron implant is made using a concentration of $2.0e^{13}$ atoms/cm$^2$ and an energy of 600 Kilo-electron volts. The second Boron implant is made using a concentration of $1.0e^{13}$ atoms/cm$^2$ and an energy of 300 Kilo-electron volts. The third Boron implant is made using a concentration of $4.0e^{13}$ atoms/cm$^2$ and an energy of 160 Kilo-electron volts. The fourth Boron implant is made using a concentration of $6.0e^{13}$ atoms/cm$^2$ and an energy of 70 Kilo-electron volts. The fifth Boron implant is made using a concentration of $1.0e^{13}$ atoms/cm$^2$ and an energy of 300 Kilo-electron volts. The above phosphorous and Boron implants are performed using the same masking step.

Because, the Phosphorous implant is performed using a relatively high energy, relatively few Phosphorous impurities may remain in p-well 114. Therefore, in accordance with the present invention, advantageously very few Boron impurities in p-well 114 are neutralized (i.e., compensated) by the phosphorous impurities. After the above implants, a thermal anneal is performed at the temperature of, e.g., 1000–1050° C. for a period of, e.g., 30 seconds. The resulting structure 515 is shown in FIG. 9.

Figure 10:
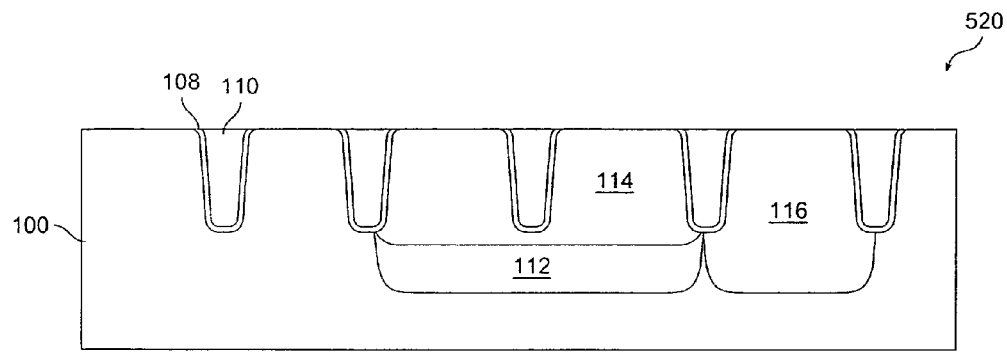
FIG. 10 is a cross-sectional view of the semiconductor structure of FIG. 9 after a second n-well is formed adjacent the first n-well and p-well.

Next, as shown in FIG. 10, a second n-well 116 is formed adjacent n-well 112 and p-well 114. N-well 116 that extends to the surface of substrate 100 has a depth that is substantially the same as the combined depth of n-well 112 and p-well 114. The resulting structure 520 is shown in FIG. 10. As is seen from FIG. 10, n-well 116 and deep n-well 112 are connected in substrate 100.

Figure 11:
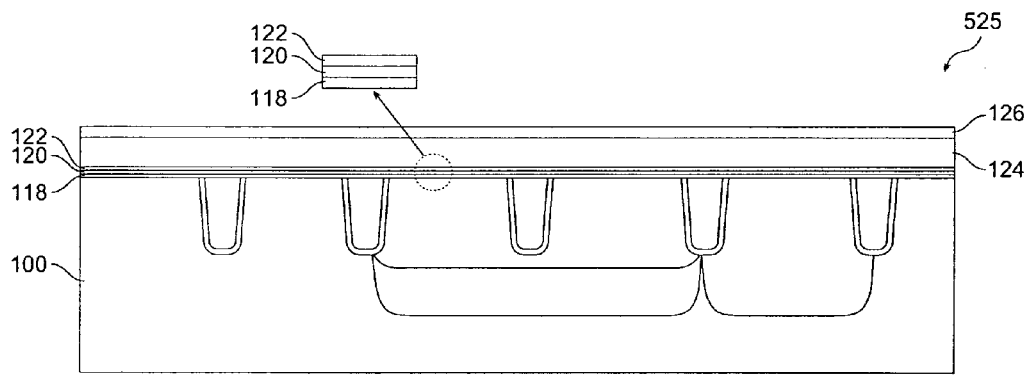
FIG. 11 is a cross-sectional view of the semiconductor structure of FIG. 10 after formation of various layers thereon.

Next, as shown in FIG. 11, a layer of thermal oxide 118 having a thickness in the range of, e.g., 15–40 Å, is grown over structure 520. Thereafter, a layer of nitride 120 having a thickness in the range of, e.g., 40–120 Å, is formed over oxide layer 118. Next, a layer of CVD oxide 122 having a thickness in the range of, e.g., 40–70 Å, is deposited over nitride layer 120. Thereafter, during a densification step, the resulting structure is heated to a temperature of, e.g., 700–850° C. for a period of, e.g., 0.5 to 1 hour. After the densification step, a layer of polysilicon (alternatively referred to herein below as poly) 124 having a thickness in the range of, e.g., 1500–3000 Å is deposited over CVD oxide layer 122. Poly layer 124 may be doped in-situ or using other conventional doping techniques, such as ion implantation Thereafter, a layer of nitride-oxide layer 126 having a combined thickness in the range of, e.g., 500–1500 Å is formed over ploy layer 124. The thickness of oxide layer in the oxide-nitride layer 126 may be between, e.g., 100–200 Å. FIG. 11 shows structure 525 that is formed after the above growth and deposition steps are performed on structure 520.

Figure 12:
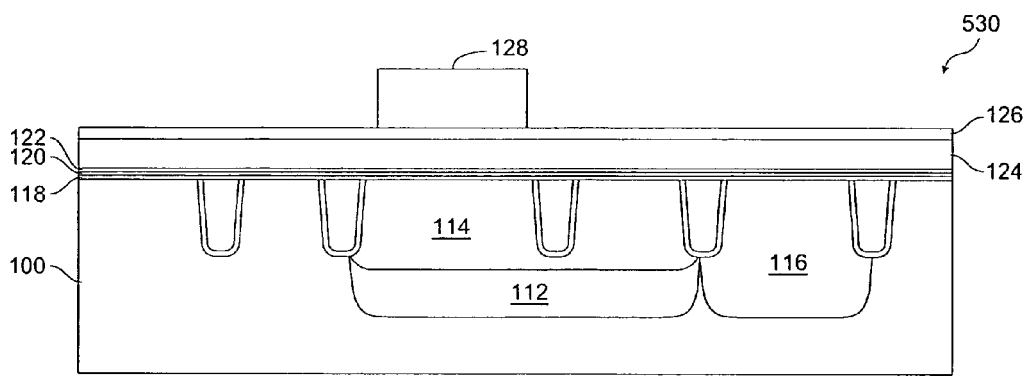
FIG. 12 is a cross-sectional view of the semiconductor structure of FIG. 11 after a photo-resist mask has been formed to define the control gate of the non-volatile device, in accordance with one embodiment of the present invention.

Next, using standard photo-resist deposition, patterning and etching steps, photo-resists masks 128 are formed over oxide-nitride layer 126. As seen on FIG. 12, photo-resists mask 128 includes one continuous piece. The resulting structures 530 is shown in FIG. 12. Mask 128 is subsequently used to define the control gates of the non-volatile devices formed in substrate 100. As described below, one masking step is used to form the control gate and two masking steps are used to form the guiding gate of the non-volatile device.

Figure 13:
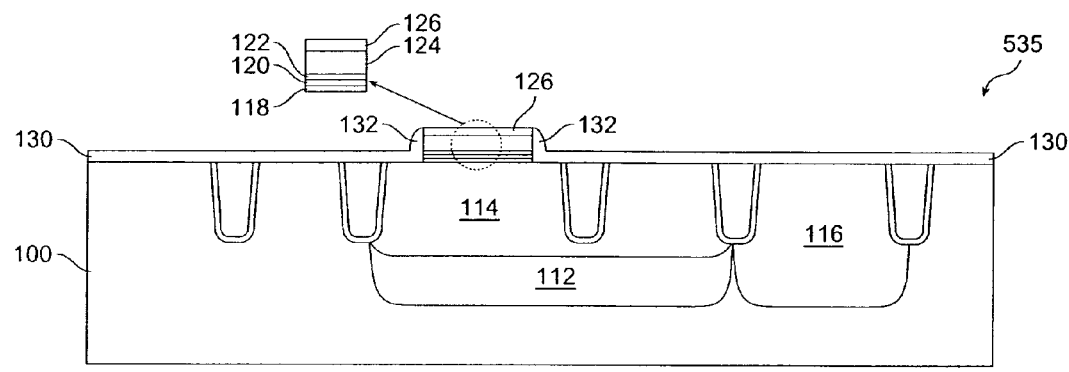
FIG. 13 is a cross-sectional view of the semiconductor structure of FIG. 12 following etching steps and oxide spacer formation steps.

Next, using conventional etching techniques, such as reactive ion etching, all the various layers grown or deposited on substrate 100, namely layers 118, 120, 122, 124 and 126 are removed from substantially all regions down to the surface of substrate 100 except for the regions positioned below masks 128. Thereafter, photo-resist masks 128 are also removed. Next, a layer of gate oxide 130 is thermally grown. In some embodiments, gate oxide layer 130 has a thickness in the range of, e.g., 100–200 Å. As is known to those skilled in the art, during this thermal oxidation, portions of polysilicon layer 124 are also oxidized, thereby causing the formation of rounded oxide regions 132, commonly referred to as spacers or parts thereof. Structure 535 of FIG. 13 shows the result of performing these steps on structure 530. It is understood that the drawings do not show some of the intermediate steps involved in forming structure 535 from structure 530.

Next, using conventional anisotropic etching techniques, oxide layer 130 overlaying substrate 100 is removed as a result of which spacers 132 are also partially etched. Next, using conventional masking and ion implantation steps, highly doped p-well region 140 is formed (see FIG. 14). In some embodiments, three to five separate Boron implants are used to form p-well implant 140. If four Boron implants are used, the first Boron implant is made using a concentration of, e.g., 1–3.3e$^{12}$ atoms/cm$^2$ and an energy of 20 Kilo-electron volts (Kev). The second Boron implant is made using a concentration of, e.g., 5–6.5e$^{12}$ atoms/cm$^2$ and an energy of 70 Kev. The third Boron implant is made using a concentration of, e.g., 2.5–3.4e$^{12}$ atoms/cm$^2$ and an energy of 180 Kev. The fourth Boron implant is made using a concentration of, e.g., 2–3.5e$^{13}$ atoms/cm$^2$ and an energy of 500 Kilo-electron volts.

Figure 14:
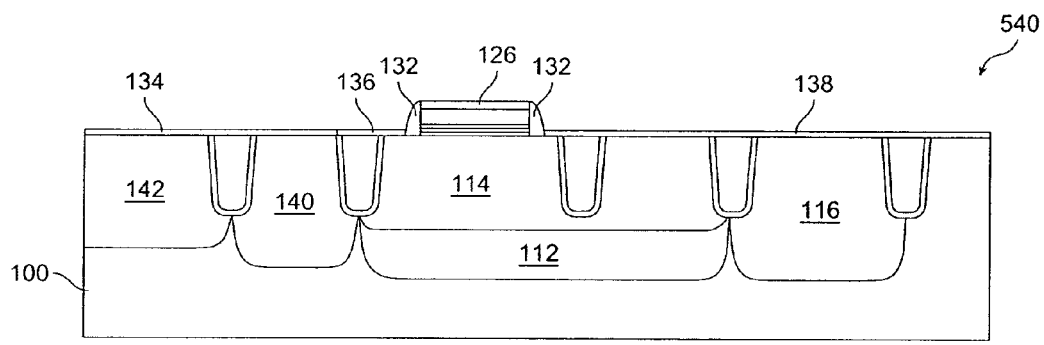
FIG. 14 is a cross-sectional view of the semiconductor structure of FIG. 13 after a second-well a third n-well and various gate oxide layers have been formed.

Next using conventional masking and ion implantation steps, highly doped n-well region 142 is formed (see FIG. 14). In some embodiments, three to five separate Phosphorous implants are used to form n-well implant 24. If four Phosphorous implants are used, the first Phosphorous implant is made using a concentration of, e.g., 5.7e$^{12}$ atoms/cm$^2$ and an energy of 50 Kev. The second Phosphorous implant is made using a concentration of, e.g., 6.6e$^{12}$ atoms/cm$^2$ and an energy of 150 Kev. The third Phosphorous implant is made using a concentration of, e.g., 5.0e$^{12}$ atoms/cm$^2$ and an energy of 340 Kev. The fourth Phosphorous implant is made using a concentration of, e.g., 4.0e$^{13}$ atoms/cm$^2$ and an energy of 825 Kilo-electron volts. After the above implants, a thermal anneal is performed at the temperature of, e.g., 1000° C. for a period of, e.g., 10 seconds.

Thereafter using several masking steps, three layers of oxide thickness each having a different thickness are thermally grown. In the surface regions identified with reference numeral 134, the oxide layer has a thickness in the range of, e.g., 15–60 Å. The semiconductor substrate underlaying oxide layer 134 is used to form core transistors having relatively high speed. In the region identified by reference numeral 136, the oxide layer has a thickness in the range of, e.g., 60–80 Å. The semiconductor substrate underlaying oxide layer 136 and overlaying p-well 114 is used to form devices adapted to operate with voltages substantially similar to the Vcc voltage (i.e., 3.3 volts), such as input/output transistors. In the region identified by reference numeral 138, the oxide layer has a thickness in the range of, e.g., 120–250 Å. The semiconductor substrate underlaying oxide layer 138 is used to form high-voltage transistors, such as high-voltage charge pump devices. The process of making multiple, e.g. 3, layers of oxide each with a different thickness is known to those skilled in the art and is not described herein. In some other embodiments, oxide layers 136 and 138 have the same thickness in the range of, e.g., 120–250 Å. Structure 540 of FIG. 14 shows the result of performing these steps on structure 535 of FIG. 13, in accordance with the present invention. It is understood that the drawings do not show some of the intermediate steps involved in forming structure 540 from structure 535.

Figure 15:
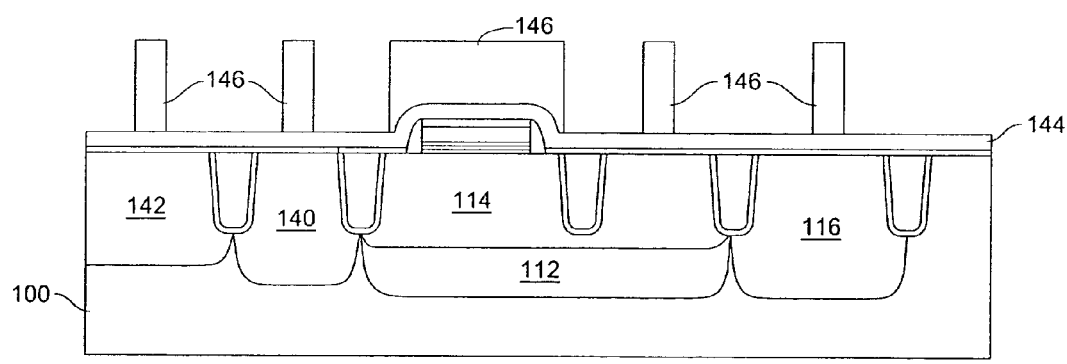
FIG. 15 is a cross-sectional view of the semiconductor structure of FIG. 14 after a second poly layer has been deposited and photo-resist masks have been formed to define gate regions of high-voltage and low-voltage NMOS and PMOS transistors as well as the guiding gates of a pair of non-volatile devices.

Next, as shown in FIG. 15, a layer of polysilicon 144 having a thickness in the range of, e.g., 1000–3200 Å, is deposited. Thereafter using standard photo-resist masking and patterning techniques, photo-resists masks 146 are formed over polysilicon layer 144. Structure 545 of FIG. 15 shows the result of performing these steps on structure 540 of FIG. 14.

Figure 16:
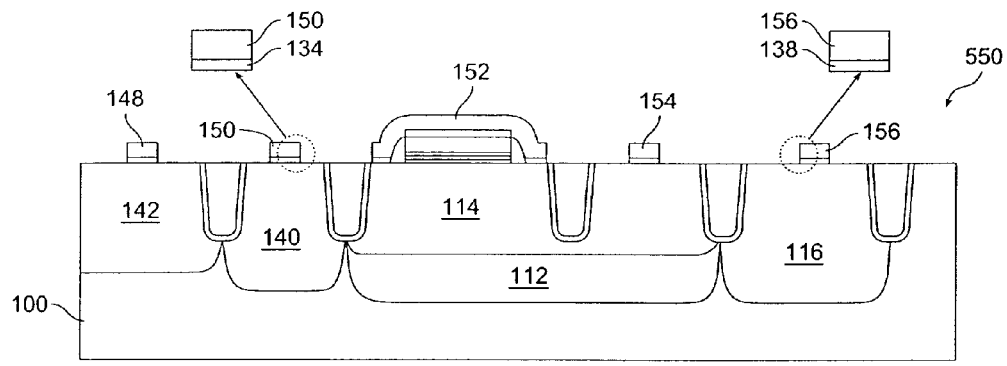
FIG. 16 is a cross-sectional view of the semiconductor structure of FIG. 15 after various etching steps are carried out to form the gate regions of high-voltage and low-voltage NMOS and PMOS transistors as well as the guiding gates of a pair of non-volatile devices.

Next, using conventional reactive ion etching (RIE) steps, polysilicon layer 144 and oxide layer 134, 136 and 138 are removed from all regions except those positioned below masks 146. Structure 550 of FIG. 16 shows the result of performing these steps on structure 545 of FIG. 15. Poly gate 148 is shown as overlaying gate oxide layer 134 formed above p-well 142. Poly gate 150 is shown as overlaying gate oxide layer 134 formed above n-well 140. Poly gate 154 is shown as overlaying gate oxide layer 138 formed above p-well 114. Poly gate 156 is shown as overlaying gate oxide layer 138 formed above n-well 116. Poly gates 148 and 150 respectively form the gates of low-voltage high-speed PMOS and NMOS transistors. Poly gates 154 and 156 respectively form the gates of high-voltage NMOS and PMOS transistors. Poly gate 152 forms the guiding gates of a pair of non-volatile devices and each is shown as overlaying, in part, gate oxide layer 136 formed below it.

Figure 17:
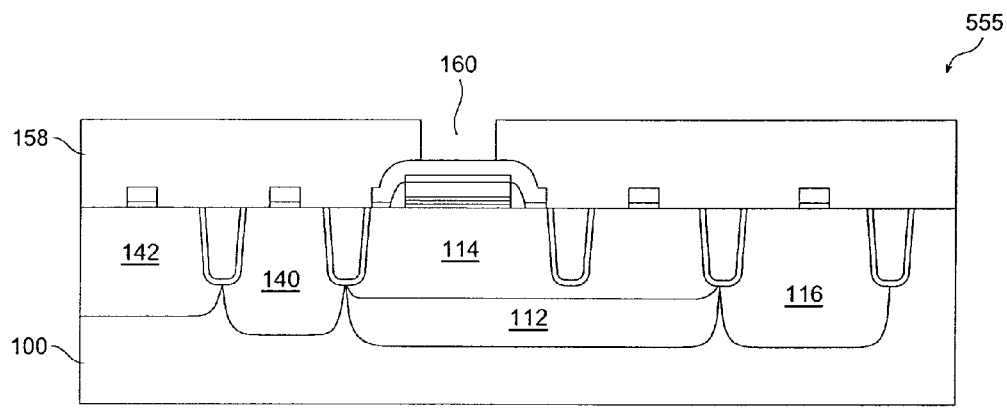
FIG. 17 is a cross-sectional view of the semiconductor structure of FIG. 16 after a photo-resist mask has been formed to separate the guiding gates of the pair of non-volatile devices and to define their respective LDD regions.

Next, using known photo-resist deposit and patterning techniques, photo-resist masks 158 are formed to form via 160. Structure 555 of FIG. 17 shows the result of performing these steps on structure 550 of FIG. 16 after formation of via 160. Thereafter, layers 118, 120, 122, 124 and 126 disposed in via 160 and underlaying polysilicon layer 152 are etched from structure 555 using standard etching step (see FIG. 18).

Figure 18:
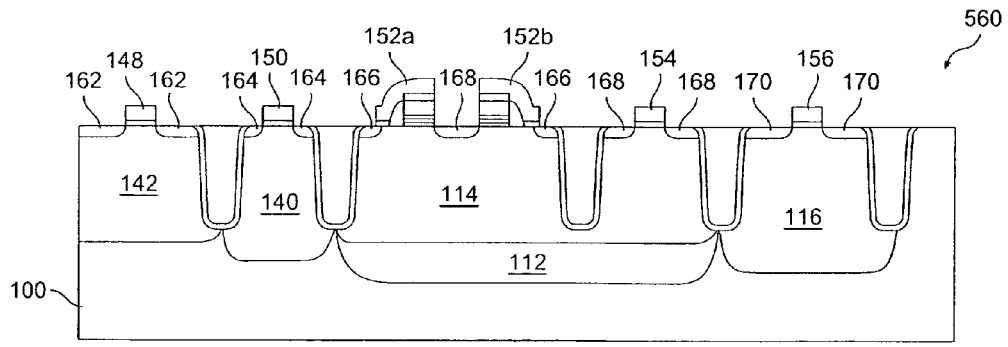
FIG. 18 is a cross-sectional view of the semiconductor structure of FIG. 17 after LDD implants.

Next, using several masking steps, low voltage p-type lightly doped (LDD) regions 162, low-voltage n-type LDD regions 164, intermediate voltage n-type LDD regions 166, high voltage n-type LDD region 168, and high voltage p-type LDD region 170 are formed. The resulting structure 560 is shown in FIG. 18.

Figure 19:
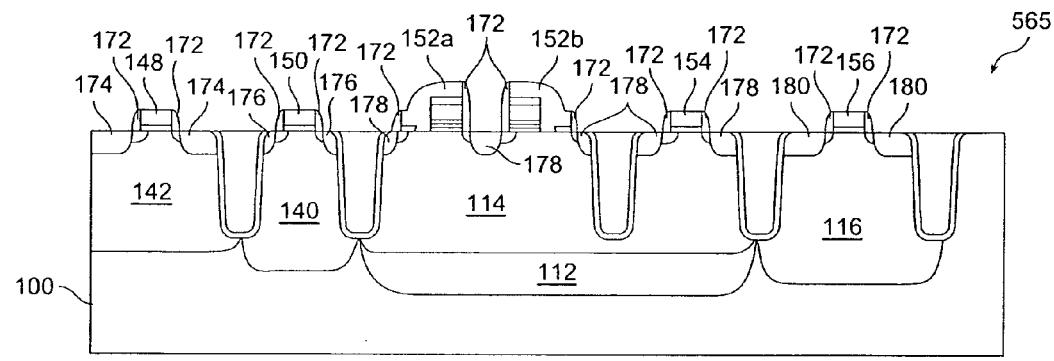
FIG. 19 is a cross-sectional view of the semiconductor structure of FIG. 18 after formation of a second oxide spacer layer.

Next, as shown in FIG. 19, using conventional processing steps, side-wall spacers 172 are formed. In some embodiments, each side-wall spacer 172 is made from oxide and each has a thickness in the rage of, e.g., 300–1500 Å. Thereafter, several p$^+$ and n$^+$ masking steps are performed to form p$^+$ source/drain regions 174, n$^+$ source/drain regions 176, n$^+$ source/drain regions 178, and p$^+$ source/drain regions 180. In some embodiments, the doping concentration of Boron used to form p$^+$ source/drain regions 174 is the same as that used to form p$^+$ source/drain regions 180. In some other embodiments, the doping concentration of Boron used to form p$^+$ source/drain regions 174 is different from that used to form p$^+$ source/drain regions 180. In some embodiments, the doping concentration of Arsenic used to form n$^+$ source/drain regions 176 is the same as that used to form n$^+$ source/drain regions 178. In some other embodiments, the doping concentration of Arsenic used to form n$^+$ source/drain regions 176 is different from that used to form n$^+$ source/drain regions 178. The resulting structure 565 is shown in FIG. 19.

Figure 20:
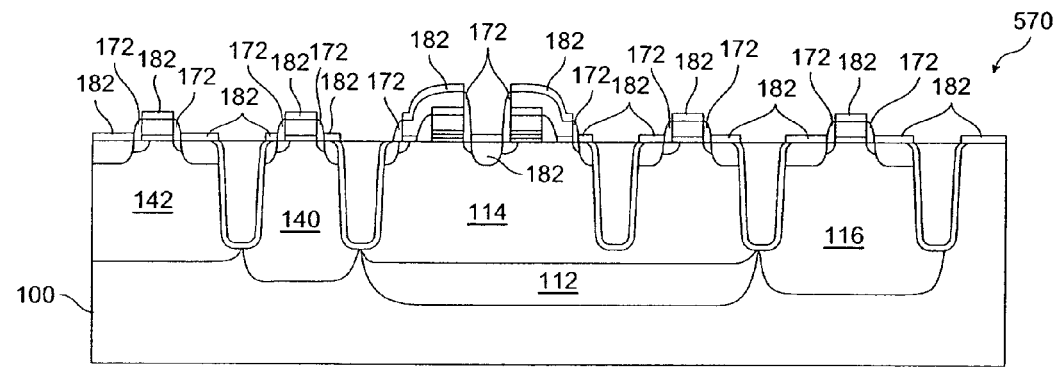
FIG. 20 is a cross-sectional view of the semiconductor structure of FIG. 19 after formation of a Salicide layer and source/drain implant steps.

Next, Salicide is deposited over structure 565. Thereafter, a high-temperature anneal cycle is carried out. As is known to those skilled in the art, during the anneal cycle, Salicide reacts with silicon and polysilicon, but not with silicon-nitride or silicon-oxide. In the resulting structure 570, which is shown in FIG. 20, Salicided layers are identified with reference numeral 182.

Figure 21:
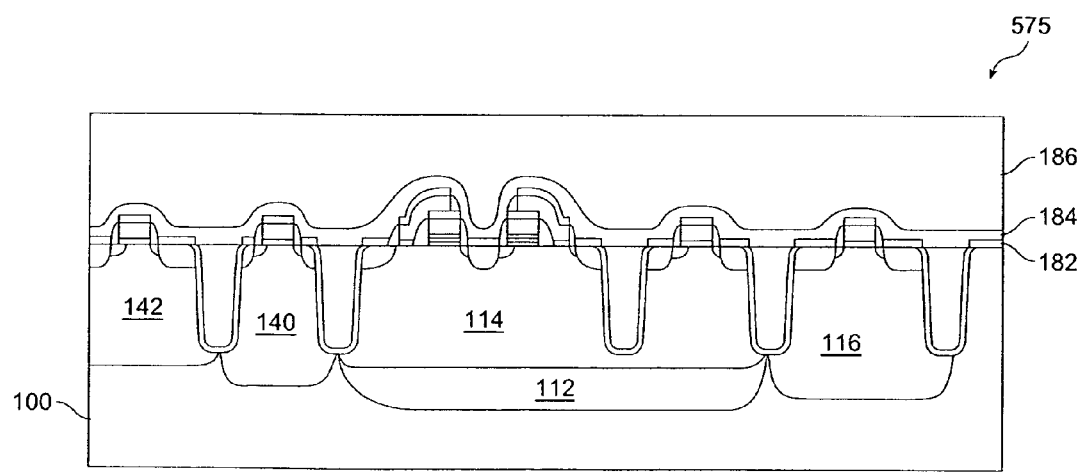
FIG. 21 is a cross-sectional view of the semiconductor structure of FIG. 20 after layers of nitride and oxide have been deposited thereon.

Next, a layer of nitride 184 is deposited over structure 570 and a layer of oxide 186 is deposited over nitride layer 184, as shown in FIG. 21.

Figure 22:
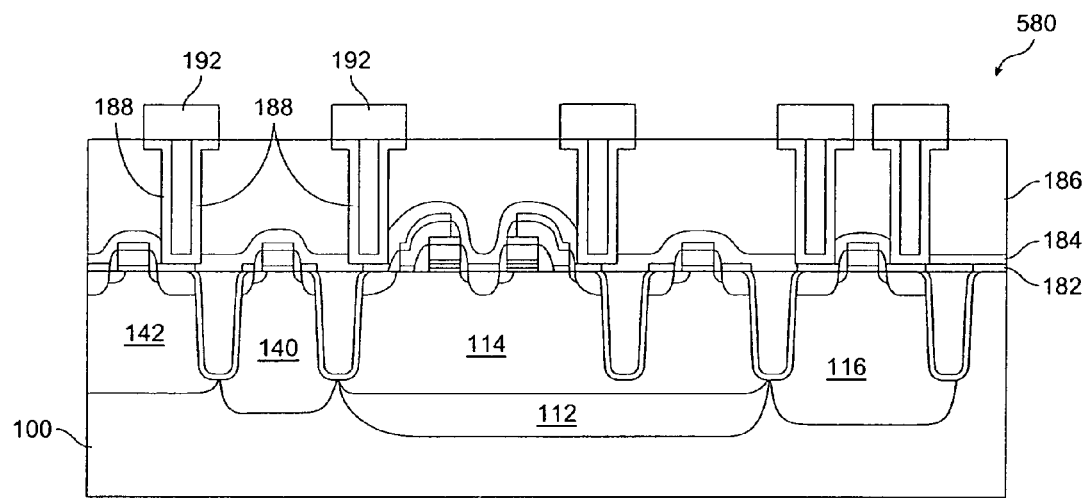
FIG. 22 is a cross-sectional view of the semiconductor structure of FIG. 21 after formation of Tungsten plugs and first metal layer.

Next, vias are formed in nitride layer 184 and oxide layer 186 to expose the underlaying Salicide layers. Thereafter, a barrier metal, such as Titanium-nitride 188 is sputter-deposited partly filling the vias. Next, Tungsten 190 is deposited over Titanium-nitride layer to fills the remainder of the vias. The deposited Tungsten is commonly referred to as Tungsten Plug. Next, using a CMP technique, the Tungsten deposited structure is planarized. Next, a metal such as Aluminum or Copper is deposited and patterned over the planarized structure. The resulting structure 580 is shown in FIG. 22. As is seen from FIG. 22, each via has disposed therein a Titanium-Nitride layer 188 and Tungsten layer 190.

The deposited and patterned Al or Copper layers are identified with reference numeral 192.

Figure 23:
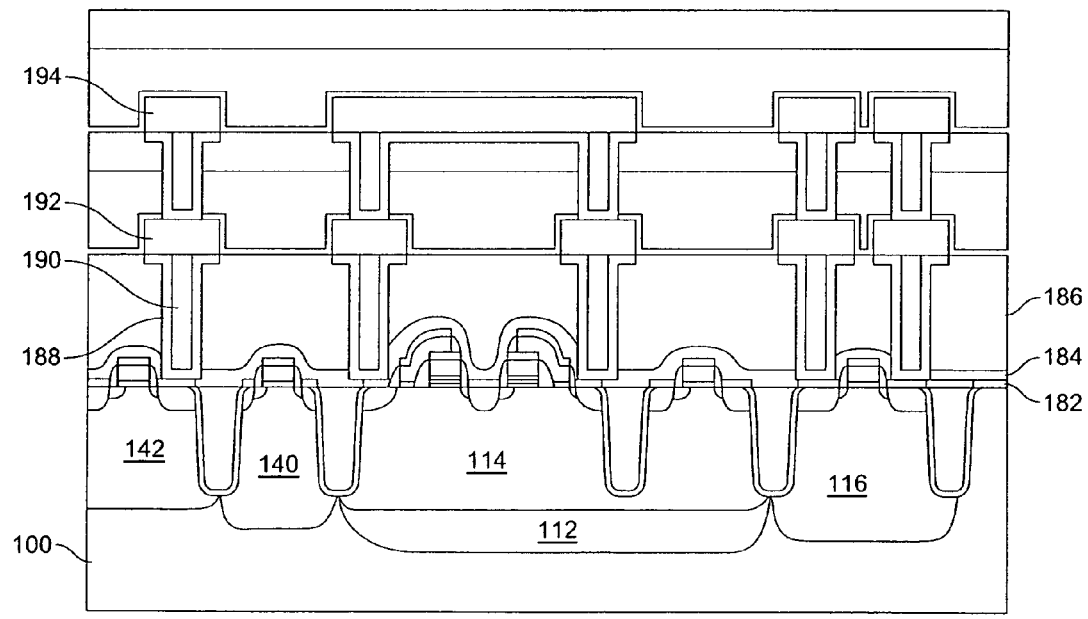
FIG. 23 is a cross-sectional view of the semiconductor structure of FIG. 22 after formation of a second metal layer.

The description above is made with reference to a single metal layer. However, it is understood that additional metal layers may be formed over metal layers 192 in accordance with known multi-layer metal processing techniques. For example, FIG. 23 shows structure 580 after it is processed to include a second metal layer 194 that is separate from metal layer 192 via layers of dielectric materials.

What is claimed is:

1. A method comprising:
   forming at least two isolation regions in a semiconductor substrate;
   forming a first well between the two isolation regions to define a body region;
   forming a first oxide layer above a first portion of the body region;
   forming a first dielectric layer above the first oxide layer;
   forming a first polysilicon layer above said first dielectric layer, said first polysilicon layer forming a control gate of a non-volatile device;
   forming a second dielectric layer above the first polysilicon layer;
   forming a first spacer above the body region and adjacent said first polysilicon layer;
   forming a second oxide layer above a second portion of the body region not covered by said first spacer;
   forming a second polysilicon layer over the second oxide layer, the first spacer, and the second dielectric layer; said second polysilicon layer forming a guiding gate of the non-volatile device;
   forming a masking layer over the second polysilicon layer;
   forming a via in the masking layer and positioned above the first portion of the body region;
   removing the second polysilicon layer, the second dielectric layer, the first polysilicon layer, the first dielectric layer, and the first oxide layer from regions exposed in the via to form self-aligned source/drain regions;
   forming a second spacer to define source and drain implant regions of the non-volatile device; and
   delivering n-type implants in the defined source and drain regions of the non-volatile device.

2. The method of claim 1 wherein said isolation regions are trench isolation regions.

3. The method of claim 2 further comprising:
   forming a second well between the two trench isolation regions and above the first well.

4. The method of claim 3 further comprising:
   performing LDD implants prior to delivering n-type implants in the defined source and drain regions of the non-volatile device, wherein a doping concentration of the LLD implant in one of the source and drain regions of the non-volatile device is greater than a doping concentration of the LLD implant in the other one of the source and drain regions of the non-volatile device.

5. The method of claim 4 wherein said first dielectric layer further includes an oxide layer and a nitride layer.

6. The method of claim 5 wherein said second dielectric layer further includes an oxide layer and a nitride layer.

7. The method of claim 6 wherein said first well is an n-well and said second well is a p-well.

8. The method of claim 7 wherein said n-well is formed using at least one implant step.

9. The method of claim 8 wherein said p-well is formed using at least two implant steps each having associated therewith a different energy and doping concentration.

10. The method of claim 9 wherein the at least two implant steps used to form the n-well and the at least two implant steps used to form the p-well region are performed using a same mask.

11. The method of claim 10 wherein said second oxide layer has a thickness greater than the thickness of the first oxide layer.

* * * * *